(12) United States Patent
Miller et al.

(10) Patent No.: US 6,911,961 B2
(45) Date of Patent: Jun. 28, 2005

(54) METHOD OF DESIGNING AN OLED DISPLAY WITH LIFETIME OPTIMIZED PRIMARIES

(75) Inventors: Michael E. Miller, Rochester, NY (US); Andrew D. Arnold, Hilton, NY (US); Paul J. Kane, Rochester, NY (US); Michael J. Murdoch, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 359 days.

(21) Appl. No.: 10/269,428

(22) Filed: Oct. 11, 2002

(65) Prior Publication Data

US 2004/0070332 A1 Apr. 15, 2004

(51) Int. Cl.[7] .................................................. G09G 3/32
(52) U.S. Cl. .............................. 345/82; 345/83; 345/76; 315/169.3; 428/690
(58) Field of Search .............................. 345/82, 83, 76, 345/77, 690; 315/169.3; 428/690

(56) References Cited

U.S. PATENT DOCUMENTS

| | | | |
|---|---|---|---|
| 5,707,745 A | | 1/1998 | Forrest et al. |
| 5,935,721 A | | 8/1999 | Shi et al. |
| 6,210,814 B1 | * | 4/2001 | Thompson et al. ......... 428/690 |
| 6,337,492 B1 | * | 1/2002 | Jones et al. ................. 257/40 |
| 6,366,025 B1 | * | 4/2002 | Yamada .................... 315/169.3 |
| 6,570,584 B1 | * | 5/2003 | Cok et al. .................... 345/690 |
| 6,693,611 B1 | * | 2/2004 | Burroughes .................. 345/83 |
| 6,747,618 B2 | * | 6/2004 | Arnold et al. ................ 345/77 |
| 2001/0000005 A1 | | 3/2001 | Forrest et al. |
| 2003/0071565 A1 | * | 4/2003 | Hatwar et al. ............. 313/504 |
| 2003/0186078 A1 | * | 10/2003 | Murata et al. ............. 428/690 |
| 2004/0113875 A1 | * | 6/2004 | Miller et al. .................. 345/82 |

FOREIGN PATENT DOCUMENTS

| | | |
|---|---|---|
| EP | 0 468 440 | 1/1992 |
| EP | 0 468 528 | 1/1992 |
| EP | 1 029 909 | 8/2000 |
| EP | 1 162 674 | 12/2001 |
| EP | 1 237 208 | 9/2002 |

OTHER PUBLICATIONS

U.S. Appl. No. 10/077,270, filed Feb. 15, 2002, Liao et al.

* cited by examiner

*Primary Examiner*—Xiao Wu
(74) *Attorney, Agent, or Firm*—Andrew J. Anderson; Thomas H. Close (57) ABSTRACT

A method of making an improved color OLED display device, includes the steps of: identifying a plurality of different OLED materials having differing chromaticity coordinates, luminance stability over time, and luminance efficiency; calculating an estimate of display lifetime for a plurality of combinations of the different OLED materials used to produce a pixel having a white point with a defined chromaticity coordinate and luminance; and selecting the combination having the maximum lifetime.

21 Claims, 5 Drawing Sheets

METHOD OF DESIGNING AN OLED DISPLAY WITH LIFETIME OPTIMIZED PRIMARIES

FIELD OF THE INVENTION

The present invention relates to a color organic light emitting diode (OLED) display having improved lifetime and to a method of designing such a display.

BACKGROUND OF THE INVENTION

Recent advances in flat panel display technology have included the advent of flat panel displays that are constructed using Organic Light Emitting Diodes (OLED). This flat panel display technology has many advantages over flat panel displays based on more popular liquid crystal display technology. Unlike liquid crystal displays that use the orientation of liquid crystal materials to modulate light from a large uniform backlight, OLED displays utilize materials that emit light. A full-color display is typically constructed by depositing three different materials that each emits a different color of light onto a substrate to create a full-color display, although they may also be constructed using a single emissive material and a color filter array. Depositing these separate subpixels in different spatial locations allows the construction of a full-color display when the light from the primary colors are integrated by the human eye to allow the perception of a large gamut of colors from three or more primary colors. During this deposition, equal areas of each of the primary colors are commonly deposited onto the substrate.

Unfortunately, when displays are constructed from the OLED materials available today, the lifetime of the display is often limited by the lifetime of one of the OLED materials, typically blue. Therefore, lifetime is one of the primary differentiating factors for this class of displays today. For this reason, the OLED materials that are commonly selected for application within today's OLED displays are selected primarily because they have very good luminance stability over time and/or high luminance efficiency. Further, the materials that are available today with good luminance stability over time and good luminance efficiency are often not very saturated. Therefore, the selection of materials based upon the luminance stability over time or the luminance efficiency of the materials results in displays with limited color gamut. More disturbingly, the selection of materials based on either luminance stability over time or good luminance efficiency does not guarantee that the materials will result in the combination of materials that produces the longest lifetime displays.

In fact, the lifetime of the final display is determined by a complex interaction of factors such as the luminance stability over time, luminance efficiency, and color coordinates of the OLED material, as well as display attributes such as the color temperature and luminance distribution for the display. For example, it is possible to construct a display from a set of red, green, and blue OLED materials and then, by selecting a blue OLED material with poorer luminance stability over time and/or luminance efficiency but with a purer blue primary, create a display with significantly improved lifetime.

There is a need therefore for an improved method for selecting OLED materials during the design of an OLED display to guarantee the selection of materials that provides a final display design with a truly longer life or an optimized tradeoff in display lifetime with display color gamut.

SUMMARY OF THE INVENTION

The need is met according to the present invention by providing a method of making an improved color OLED display device that includes the steps of: identifying a plurality of different OLED materials having differing chromaticity coordinates, luminance stability over time, and luminance efficiency; calculating an estimate of display lifetime for a plurality of combinations of the different OLED materials used to produce a pixel having a white point with a defined chromaticity coordinate and luminance; and selecting the combination having the maximum lifetime.

Advantages

The present invention has the advantage of optimizing the selection of OLED materials during the design of a display, co-optimizing color gamut and useful lifetime of a full-color OLED display device by considering the differences in the luminance efficiencies, luminance stability over time and the chromaticity coordinates of the materials employed in the display device, as well as the overall requirements for display lifetime and color gamut.

DETAILED DESCRIPTION OF THE INVENTION

The term "display device" is employed to designate a screen capable of electronically displaying video images or text. The term "pixel" is employed in its art-recognized usage to designate an element in a display device that can be addressed to form one part of a picture. The term "full color" is employed to describe multicolor display devices that are capable of forming color images. Generally red, green, and blue color primaries constitute the three primary colors from which all other colors can be generated by appropriately mixing these three primaries. It is recognized that a "full color" display may also be formed from more than three colors. The term gamut refers to the range of all colors that can be displayed on a given display device. In a three-color device, the "gamut" refers to all colors that lie on or within a triangle that is created between the CIE color coordinates of the three subpixels that are used to compose the pixels of the display device. The term "in-gamut" refers to all colors that are within the set of gamut colors. The term "subpixel" is used in full color display devices and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term pixel or subpixel is generally used to designate the smallest addressable unit in a display device.

This invention is directed to a method for designing a full color OLED display in which the materials that are used to compose the subpixels are selected to co-optimize the useful lifetime and the color gamut of the display device. This invention is achieved by calculating the useful lifetime of the final display device wherein the calculation of useful lifetime is estimated from the relative luminance stability over time, the luminance efficiency, and the chromaticity coordinates of the light emitting materials that make up the subpixels of the display. In the context used here, useful lifetime of the display refers to the number of hours in which the display can satisfy requirements such as display luminance output and/or white point stability.

This method uses a model of OLED display lifetime. This model allows one to exploit the fact that as the color purity of any one OLED material that is used to construct a subpixel increases, the percentage of the total display luminance that is required from the individual subpixel to create an in-gamut color decreases. This fact makes it possible to create a display device with increased lifetime by constructing a subpixel, typically a red or blue subpixel, from a material with greater color purity. This increase in useful lifetime may occur even when the OLED material that is used to construct the subpixel has lower luminance efficiency and/or luminance stability over time.

Figure 1:
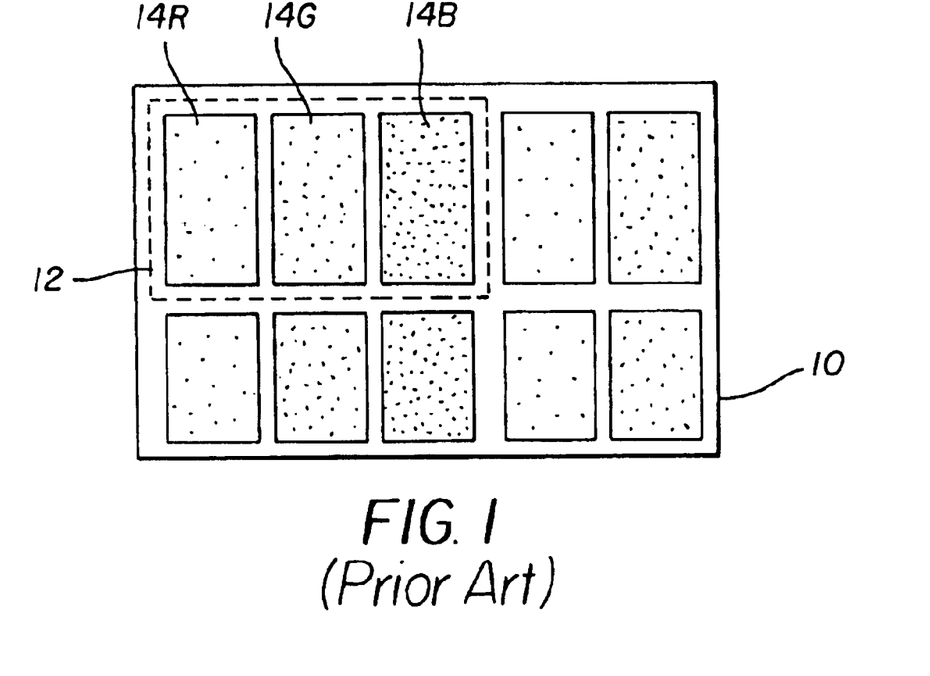
FIG. 1 is a schematic diagram showing a pixel on a full-color display device having subpixels as known in the prior art.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). FIG. 1 is a schematic diagram that shows a portion of a full color OLED display device 10 having an array of pixels 12, each pixel 12 having subpixels 14 as is known in the prior art. The subpixels 14 are labeled R, G, and B representing red, green and blue light emitting subpixels, respectively.

Figure 2:
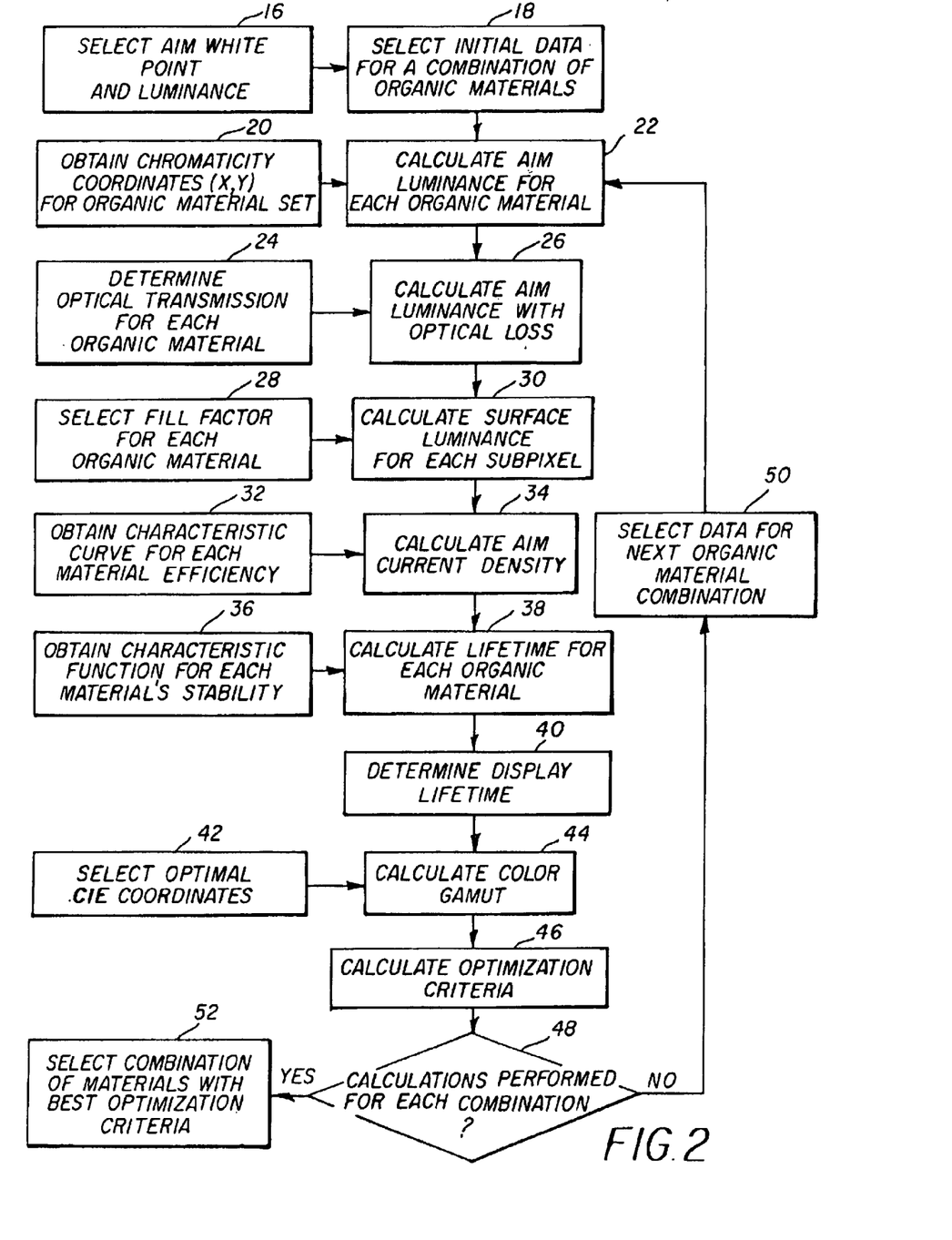
FIG. 2 is a flow chart of the process used to determine the optimal set of OLED materials according to the present invention.

Referring to FIG. 2, the optimal set of materials that are used to compose the red, green, and blue subpixels in the display are determined according to one embodiment of the present invention by considering the aim white point and the luminance of the display to be designed; the fill factors of the red, green, and blue subpixels; and the optical transmission characteristics of the subpixels within the final display configuration. Additionally, characteristics of the OLED materials that are available to be used in construction of the subpixels including the luminance efficiency of the emissive materials; the luminance stability over time of the emissive materials and the chromaticity coordinates of the emissive materials are considered.

To determine the optimal combination of OLED materials that are to be used to compose the subpixels in the display device according to the present invention, the aim white point and luminance of the display device are selected 16. Next, an initial combination of OLED materials that may be used to construct the subpixels in the display device are selected 18. The chromaticity coordinates for the selected OLED materials when used to compose the subpixels in a representative display device are obtained 20. The aim luminance required from each subpixel is then calculated 22 from these values. If the display device is characterized using a tricolor, additive color system, these values can be calculated using the following equations:

$$Y_r = \frac{y_r(x_w(-y_b + y_g) + x_g(y_b - y_w) + x_b(-y_g + y_w))Y_w}{(x_g y_b - x_r y_b - x_b y_g + x_r y_g + x_b y_r - x_g y_r) y_w} \quad (1)$$

$$Y_g = \frac{y_g(x_w(y_b - y_r) + x_b(y_r - y_w) + x_r(-y_b + y_w))Y_w}{(x_g y_b - x_r y_b - x_b y_g + x_r y_g + x_b y_r - x_g y_r) y_w} \quad (2)$$

$$Y_b = \frac{y_b(x_w(-y_g + y_r) + x_r(y_g - y_w) + x_g(-y_r + y_w))Y_w}{(x_g y_b - x_r y_b - x_b y_g + x_r y_g + x_b y_r - x_g y_r) y_w} \quad (3)$$

where: $Y_w$ represents the luminance of the final display device when the display device is turned on to its maximum value; $x_w$ and $y_w$ represent the chromaticity coordinates of the desired display white point; $Y_r$, $Y_g$, and $Y_b$ represent the luminance values that must be output from the display device to create the selected aim white point and luminance when the red, green, and blue subpixels are all driven at their maximum value; $x_r$, $x_g$, and $x_b$ represent the respective x chromaticity coordinates of the red, green, and blue OLED materials that will be used to compose the subpixels in the display device; and $y_r$, $y_g$, and $y_b$ represent the respective y chromaticity coordinates of the red, green, and blue OLED materials that will be used to compose the subpixels in the display device.

An optical transmission factor is then determined 24 for each subpixel in the display device. This optical transmission factor indicates the proportion of the luminance of each subpixel that will be emitted by the display. The optical transmission factor may include factors such as absorptions that take place within a polarizer or other layers within the display device structure and reflections that occur at the interface between different optical layers within the display device structure. The luminance values for each of the color subpixels are then calculated 26 by multiplying the previously calculated luminance values by the inverse of this proportion to determine the aim luminance for each subpixel before unwanted absorptions.

A fill factor for each subpixel is then selected 28. This fill factor is the proportion of the total pixel area that will emit light of a single color, i.e. the emissive area of a subpixel divided by the total pixel area. The necessary surface luminance value for each color subpixel is then calculated 30 by multiplying the luminance value determined in 26 by the inverse of the fill factor.

Characteristic curves relating output luminance to input current density (see FIG. 4) are then obtained 32 for the OLED materials that will be used to construct each subpixel. For most OLED materials, this characteristic curve will be a linear function that allows the current density to be calculated as a function of luminance. These functions may be of the form:

$$I=(L-b)/a, \quad (4)$$

where: I represents the current density required to drive each subpixel; L represents the surface luminance that was previously calculated 30; and a and b are constants that differ for each OLED material. These functions are then used to calculate 34 the aim current density required to drive each subpixel to display the selected aim white point and luminance.

Characteristic curves relating current density to the luminance stability over time of each OLED material (see FIG. 5) are then obtained 36 for the materials that will be used to construct each subpixel. For example, a power function of the form:

$$T=cI^d \quad (5)$$

may be used to estimate the time until the subpixel has lost half its original luminance where T is the time and c and d are constants that are different for each different OLED material. These characteristic curves are determined empirically by measuring the light output from test pixels that are produced using the processes that will be employed to manufacture the display device. These characteristic functions may then be used to calculate 38 the lifetime of each subpixel within the display device.

The useful lifetime of the display device is then determined 40 by selecting from the lowest of the subpixel display lifetimes. That is, the display device will be unable to meet the requirements of the final application when any of the subpixels that compose the display are unable to meet the requirements of the final application and therefore the useful lifetime of the display device is equal to the lower of the subpixel lifetimes. The above described process is repeated 50 for a plurality of combinations of OLED materials, and the set of materials with the optimum lifetime is selected 52 for the display device.

The following steps 42 through 46 are optional. A set of optimal CIE coordinates are then selected 42. This set of optimal CIE coordinates may be CIE coordinates for any set of subpixels that will meet or exceed the requirements for the final display. One particularly useful set of chromaticity coordinates are the coordinates published in the Comite' Consultatif Internationale des Radiocommunications Recommendation 709, titled the HDTV Standard for the Studio and Internationale Programme Exchange.

Applying the chromaticity coordinates that were obtained 20 and the aim white point of the display that was selected 16, a value representing the usefulness of the color gamut can be calculated. For example, the function:

$$G = \begin{bmatrix} a(d_{r-gopt} - d_{r-g})^b + c(d_{g-bopt} - d_{g-b})^d + (d_{b-ropt} - d_{b-r})^e + \\ f(d_{r-wopt} - d_{r-w})^g + h(d_{g-wopt} - d_{g-w})^i + j(d_{b-wopt} - d_{b-w})^b \end{bmatrix} \quad (6)$$

may be used to calculate 44, the utility of the color gamut where $d_{r-gopt}$, $d_{g-bopt}$, $d_{b-ropt}$ are the Euclidean distances between the CIE coordinates of the selected 42 set of optimal red-green, green-blue, blue-red primaries; $d_{r-wopt}$, $d_{g-wopt}$, $d_{b-wopt}$ are the Euclidean distances between the CIE coordinates of the optimal red, green, and blue primaries and the CIE coordinates of the selected white point; $d_{r-g}$, $d_{g-b}$, $d_{b-r}$ are the Euclidean distances between the red-green, green-blue, and blue-red CIE coordinates for the red, green and blue light emissive materials; and $d_{r-w}$, $d_{g-w}$, $d_{g-b}$ are the Euclidean distances between the CIE coordinates for the red, green, blue light emissive materials and the CIE coordinates of the selected display white point; a, b, c, d, e, f, h, and j are all scaling constants and g, i, and k are constants that will normally be greater than 1 to discourage the selection of a single primary that is close to the whitepoint.

Next, an optimization criteria may be calculated 46. This criterion combines the display lifetime that was previously determined 40 with the color gamut utility that was calculated 44. For example, a function of the form:

$$C=aG+bS \quad (7)$$

may be specified where C is the optimization criteria, a and b are constants, G is the gamut utility that was previously determined 44 and S is the calculated 40 display device lifetime. Note that if one wishes to only optimize the useful lifetime or the color gamut of the display device, the constants a and b can be set to 0 and 1 or to 1 and 0 to indicate that only one of these criteria will contribute to the final result.

Once this optimization criterion has been calculated, a decision 48 is made as to whether this computation has been performed for all possible OLED material combinations. If the computations have not been made for all available OLED material combinations, the next combination of OLED materials are selected 50, and the calculations 22, 26, 30, 34, 38, 40, 44, and 46 are repeated for this new combination. If the computations have been completed for all possible combinations, the material combination for which the highest criteria value was calculated 46 is selected 52 as the best combination of OLED materials from which to construct the subpixels in a full-color OLED display.

Figure 3:
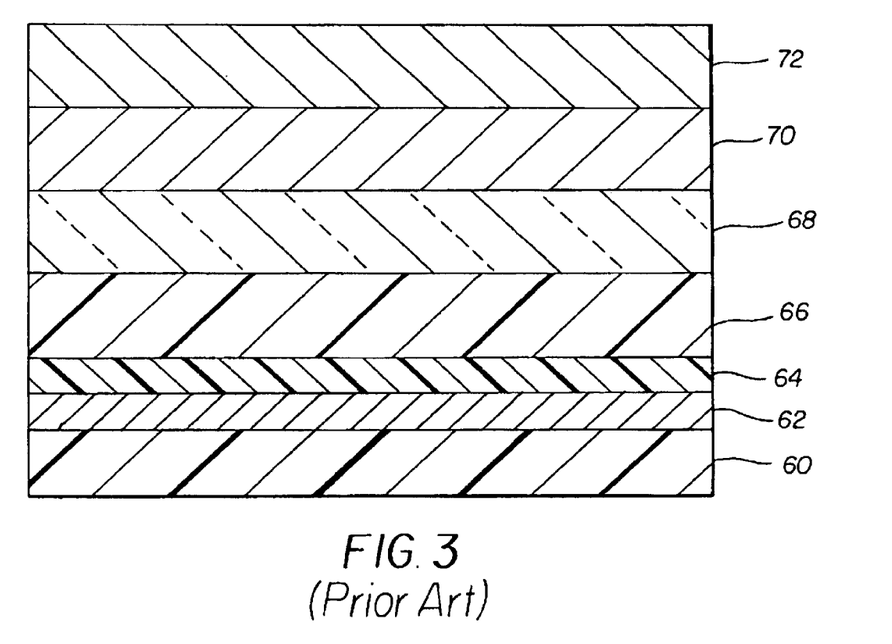
FIG. 3 is schematic cross-sectional diagram of a typical prior art organic light emitting display structure.

There are numerous configurations of the organic layers wherein the present invention can be successfully practiced. A typical prior art structure is shown in FIG. 3 and is comprised of a substrate 60, an anode layer 62, a hole-injecting layer 64, a hole-transporting layer 66, a light-emitting layer 68, an electron-transporting layer 70, and a cathode layer 72. These layers are described in detail below. Note that the substrate may alternatively be located adjacent to the cathode, or the substrate may actually constitute the anode or cathode. The organic layers between the anode and cathode are conveniently referred to as the organic light emitting layer. The total combined thickness of the organic light emitting layer is preferably less than 500 nm.

The OLED device of this invention is typically provided over a supporting substrate 60 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

When EL emission is viewed through the anode 62, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

It is often useful to provide a hole-injecting layer 64 between the anode 60 and hole-transporting layer 66. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 66 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N '-tetra-1-naphthyl-4,4'-diaminobiphenyl
N,N,N',N '-tetra-2-naphthyl-4,4 '-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 68 of the organic light emitting layer includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to: derivatives of anthracene, such as 9,10-di-(2- naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds. Electron-Transporting Layer (ETL)

Preferred thin film-forming materials for use in forming the electron-transporting layer 70 of the organic light emitting layers of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 70 and 68 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

When light emission is viewed solely through the anode, the cathode 72 used in this invention can be comprised of nearly any conductive material. Desirable materials have good film-forming properties to ensure good contact with the underlying organic layer, promote electron injection at low voltage, and have good luminance stability over time. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat Nos. 5,703,436, 5,608,287, 5,837,391, 5,677,572, 5,776,622, 5,776,623, 5,714,838, 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

In addition to the device architecture described above, each organic light emitting layer may be comprised of a series of organic stacks as described in copending U.S. Ser. No. 10/077,270 filed Feb. 15, 2002 by Liao et al., which is incorporated herein by reference.

HYPOTHETICAL EXAMPLE 1

Inventive

To further demonstrate the difference between the system and method described herein from the prior art, an example is provided. Within this example, it is assumed that the lifetime is defined as the number of hours required for any of the three-color subpixels to decay to 50% of their original luminance. To utilize this method, it is important to establish the specific luminance efficiencies and luminance stabilities over time of the OLED materials from which the display is to be built, as well as to establish the aim characteristics of a display.

Figure 4:
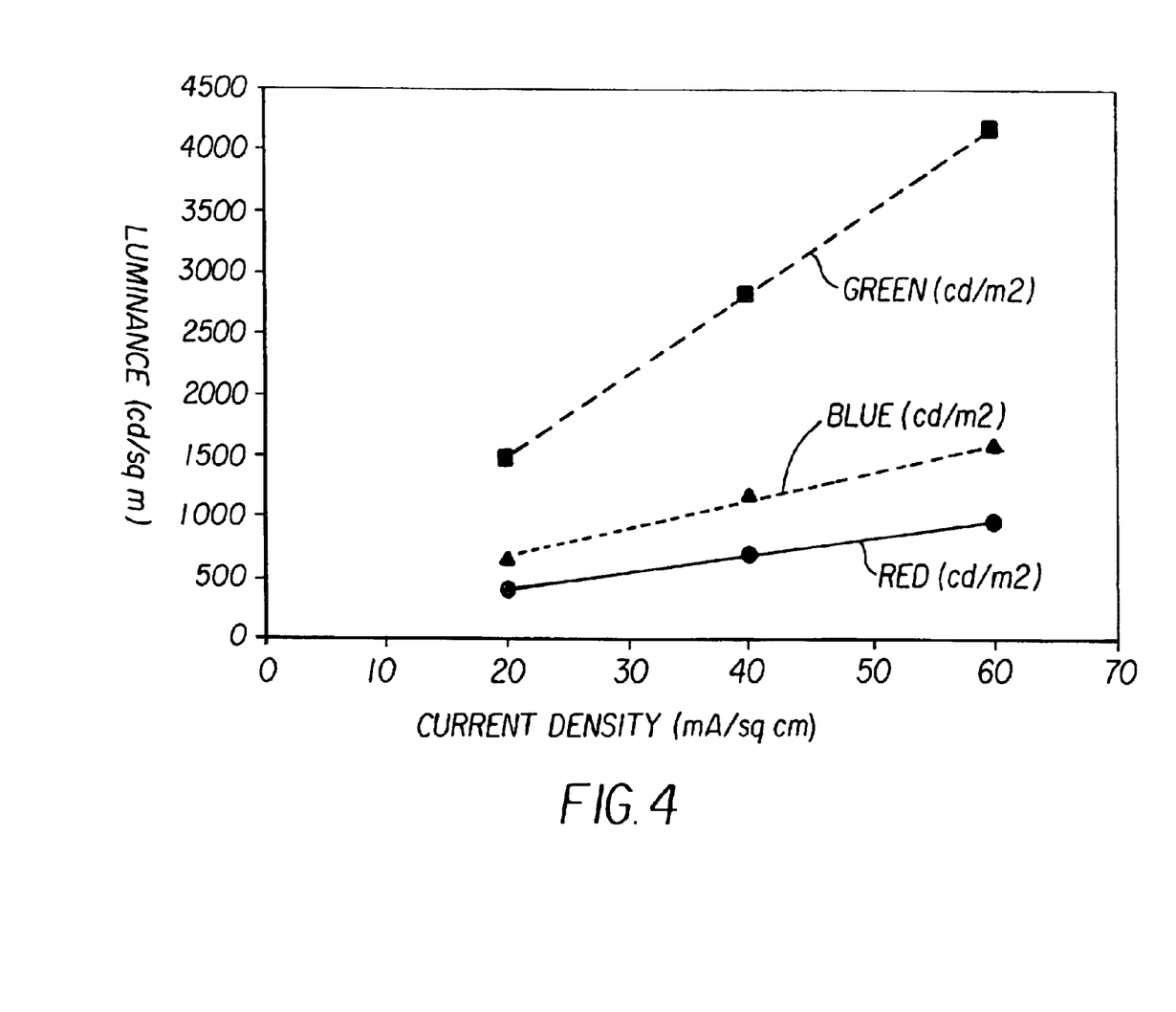
FIG. 4 is a graph useful in describing the present invention, showing the relationship between the luminance output and current density in OLED materials that emit red, green and blue light respectively.

In this example, it is assumed that a number of OLED test cells are available that have been prepared using the candidate OLED materials to be used in the display device. These test cells are driven and configured as similarly to the final display device as possible. The efficiencies and chromaticity coordinates for each test cell are determined by driving the test cell to a series of different current densities and measuring the luminance and chromaticity coordinate for each test cell. The average performance of these test cells are calculated from the measured data to determine the luminance efficiency of the red, green, and blue subpixels. Equations are then fit to this data to determine the efficiency curve for each material. A sample data set and linear fits for an example family of OLED materials are shown in FIG. 4. The linear fits shown in this figure can be described using the slopes and offsets for luminance efficiencies shown in Table 1 below.

Figure 5:
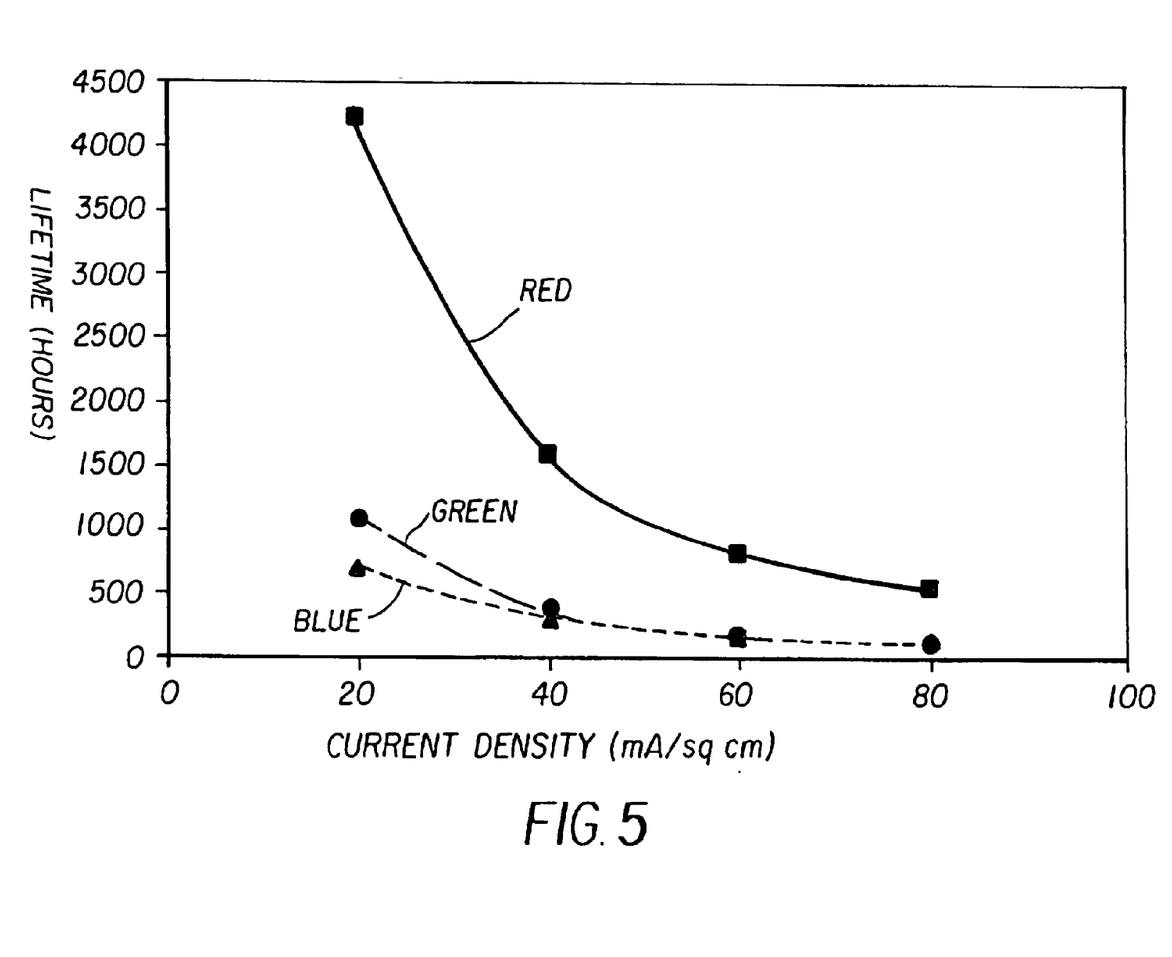
FIG. 5 is a graph useful in describing the present invention, showing the relationship between the material luminance stability over time and current density in OLED materials that emit red, green and blue light respectively.

The luminance stability over time of each OLED material may then be determined by selecting a subset of the test cells for each OLED material and driving them with a single current density while measuring the luminance decay of the material over time. Once again, the average performance may be determined from a group of test cells that were prepared using the same OLED materials and driven and configured as similarly to the final display as possible. A sample data set and power function fit to this data are shown in FIG. 5 for the same example family of OLED materials. The multiplication and exponential factors for these equations that characterize luminance stability over time are shown in Table 1 below.

The remaining characteristics of the display and of the materials were likewise determined empirically. Table 1 lists the important characteristics for the red, green, and blue subpixels to be used in constructing the final display. As shown in this table, the chromaticity coordinates, a characterization of the luminance efficiency, luminance stability over time and optical transmission factor for each subpixel are included.

To perform this example, it is necessary to have several candidates of OLED materials that can be used to construct at least one of the red, green, or blue subpixels in the display device. Table 2 lists the characteristics of three additional hypothetical blue OLED materials. To simplify this example, the characteristics of blue OLED material #2 are identical to blue OLED material #1 with the exception that it has lower luminance efficiency. The characteristics of blue OLED material #3 are identical to blue OLED material #1 with the exception that it has poorer luminance stability over time. Finally, the characteristics of blue OLED material #4 are such that it has both the lower luminance efficiency of blue OLED material #2 and the lower luminance stability over time of blue OLED material #3. However, blue OLED material #4 has the added advantage that its chromaticity coordinates are slightly closer to an optimal blue and for this reason is required to produce less luminance in the final display device configuration.

TABLE 1

| Characteristic | Red Light Emitting Material | Green Light Emitting Material | Blue Light Emitting Material #1 |
|---|---|---|---|
| x chromaticity coordinate | 0.6492 | 0.3118 | 0.1478 |
| y chromaticity coordinate | 0.3474 | 0.6196 | 0.1909 |
| Slope for efficiency equation | 16.82 | 70.33 | 28.03 |
| Intercept for efficiency equation | 0.0 | 0.0 | 0.0 |

TABLE 1-continued

| Characteristic | Red Light Emitting Material | Green Light Emitting Material | Blue Light Emitting Material #1 |
|---|---|---|---|
| Multiplication factor for the luminance stability equation | 348006 | 116540 | 37234 |
| Power for luminance stability equation | −1.4687 | −1.6650 | −1.3148 |
| Optical transmission factor | 0.5 | 0.5 | 0.5 |

TABLE 2

| Characteristic | Blue Light Emitting Material #2 | Blue Light Emitting Material #3 | Blue Light Emitting Material #4 |
|---|---|---|---|
| x chromaticity coordinate | 0.1478 | 0.1478 | 0.135 |
| y chromaticity coordinate | 0.1909 | 0.1909 | 0.175 |
| Slope for efficiency equation | 26.03 | 28.03 | 26.03 |
| Intercept for efficiency equation | 0.0 | 0.0 | 0.0 |
| Multiplication factor for the luminance stability equation | 37234 | 37234 | 37234 |
| Power for luminance stability equation | −1.3148 | −1.35 | −1.35 |
| Optical transmission factor | 0.8 | 0.8 | 0.8 |

The display characteristics for this example are shown in Table 3 below. Table 3 lists the luminance and chromaticity coordinates for the display white point as well as the aim fill factor (i.e. the proportion of the pixel area that will emit light of each color in the final display). It should be noted that in this example we assume the subpixels have equal areas, although it is recognized that displays may be developed having subpixels with unequal area.

TABLE 3

| Display Characteristic | Value |
|---|---|
| Luminance of 100% white | 100 cd/sq m |
| x chromaticity coordinate for white | 0.3128 |
| y chromaticity coordinate for white | 0.3292 |
| Fill factor per pixel | 0.72 |

To further simplify this example, we will assume that the constants a and b in equation 7 are equal to 0 and 1, respectively. That is, we will assume that we do not care about the final gamut of the display and only wish to optimize the lifetime of the display device. In this simplified example, it is not necessary to perform the calculations shown in equations 6 or 7 to perform this optimization.

Employing the data in Tables 1, 2 and 3, and using the method of the present invention as described above, one can determine the lifetime of each subpixel in a display that is constructed from the red and green OLED materials shown in Table 1 in combination with the blue OLED material #1 shown in Table 1. This computation indicates that the subpixel with the shortest lifetime is the blue subpixel that has a lifetime of about 3900 hours. Performing these same calculations, replacing the blue OLED material #1 with the blue OLED material #2, which has a lower luminance efficiency, the lifetime of the blue subpixel is reduced to only 3539 hours. Once again, performing these same calculations but replacing the blue OLED material #2 with the blue OLED material #3, which has the same luminance efficiency as blue OLED material #1 but a lower luminance stability over time, provides a blue subpixel lifetime of only 3672 hours. Finally, performing the same calculations but replacing the blue OLED material #3 with blue OLED material #4, which has the lower luminance efficiency of OLED material #2 and the lower luminance stability over time of the OLED material #3 but a purer blue chromaticity coordinate results in a blue subpixel lifetime of 3974 hours. In each of these calculations, the lifetime of the blue subpixel is always the lowest of the three subpixels. Therefore within this example, the useful lifetime of the display device is limited by the lifetime of the blue subpixel. In this example, the blue OLED material #4 would be selected as the preferred blue OLED material and when used within the display device specified above would provide a device lifetime of 3974 hours. While not considered in this example, it is worth noting that blue OLED material #4 has the added advantage that it provides a purer blue primary, enhancing the color gamut of the display over any of the alternative blue OLED materials.

EXAMPLE 2

Comparative

A conventional approach to OLED material selection during display device design is to select the set of materials with the highest efficiency. Within this example, this criteria would lead to the selection of either blue OLED material #1 or blue OLED material #3 resulting in display device lifetimes of 3900 and 3672 hours respectively. This approach would also produce a display device with a smaller color gamut as compared to the method of the present invention.

EXAMPLE 3

Comparative

Another conventional approach to OLED material selection during display device design is to select the set of materials with the highest luminance stability over time. Within this example, this criteria would lead to the selection of either blue OLED material #1 or blue OLED material #2 resulting in display device lifetimes of 3900 and 3579 hours, respectively. This approach would also produce a display device with a smaller color gamut as compared to the method of the present invention.

Thus it can be readily seen that the method of the present invention provides an improvement in the tradeoff between useful display device lifetime and color gamut of the display over the conventional approaches to material selection.

The invention has been described in detail with particular reference to certain preferred embodiments thereof, but it will be understood that variations and modifications can be effected within the spirit and scope of the invention. One such variant could be the use of more than three colors.

PARTS LIST

| | |
|---|---|
| 10 | OLED display device |
| 12 | pixel |
| 14 | subpixel |
| 16 | select step |
| 18 | select step |
| 20 | obtain step |
| 22 | calculate step |
| 24 | determine step |
| 26 | calculate step |
| 28 | select step |
| 30 | calculate step |
| 32 | obtain step |
| 34 | calculate step |
| 36 | obtain step |
| 38 | calculate step |
| 40 | determine step |
| 42 | select step |
| 44 | calculate step |
| 46 | calculate step |
| 48 | decision step |
| 50 | select step |
| 52 | select step |
| 60 | substrate |
| 62 | anode layer |
| 64 | hole-injecting layer |
| 66 | hole-transporting layer |
| 68 | light-emitting layer |
| 70 | electron-transporting layer |
| 72 | cathode layer |

What is claimed is:

1. A method of making an improved color OLED display device, comprising the steps of:
   a) identifying a plurality of different OLED materials having differing chromaticity coordinates, luminance stability over time, and luminance efficiency;
   b) calculating an estimate of display lifetime for a plurality of combinations of the different OLED materials used to produce a pixel having a white point with a defined chromaticity coordinate and luminance; and
   c) selecting the combination having the maximum lifetime.

2. The method claimed in claim 1, wherein the lifetime of the display is determined according to the equation:

$$L_i = f(E_i, T_i, Y_i)$$

where $L_i$ is the lifetime of the display constructed from the different material combinations, $E_i$ are the luminance efficiencies of the OLED materials used to construct the differently colored subpixels; $T_i$ are the luminance stability over time for the OLED materials used to construct differently colored subpixels; and $Y_i$ are the luminances of the differently colored subpixels necessary to obtain a white point of a specified luminance and chromaticity coordinate.

3. The method claimed in claim 2, wherein the luminance stability over time is defined as:

$$T_i = cI^d$$

where c and d are constants and I is the current density through the subpixel.

4. The method claimed in claim 1, wherein the combinations include materials that emit red, green and blue light, respectively.

5. The method claimed in claim 1, wherein a combination of three different OLED materials are used to form the color display device.

6. The method claimed in claim 1, wherein a combination of more than three different OLED materials are used to form the color display device.

7. A color display device according to the method of claim 1.

8. A method of designing an improved color OLED display device, comprising the steps of:
  a) identifying a plurality of different OLED materials having differing chromaticity coordinates, luminance stability over time, and luminance efficiency;
  b) calculating an estimate of display lifetime for a plurality of combinations of the different OLED materials used to produce a pixel having a white point with a defined chromaticity coordinate and luminance;
  c) calculating a figure of merit for the color gamut for each combination; and
  d) using an optimization criterion that includes the display lifetime and color gamut figure of merit to select one of the plurality of combinations of OLED materials for use in the display.

9. The method claimed in claim 8, wherein the lifetime of the display is determined according to the equation:

$$L_i = f(E_i, T_i, Y_i)$$

where $L_i$ is the lifetime of a display constructed from the different material combinations; $E_i$ are the luminance efficiencies of the OLED materials used to construct for the differently colored subpixels; $T_i$ are the luminance stability over time of the OLED materials used to construct the differently colored subpixels; and $Y_i$ are the luminances of the differently colored subpixels necessary to obtain a white point of a specified luminance and chromaticity coordinate.

10. The method claimed in claim 8, wherein the figure of merit is determined according to the equation:

$$G = \begin{bmatrix} a(d_{r-gopt} - d_{r-g})^b + c(d_{g-bopt} - d_{g-b})^d + (d_{b-ropt} - d_{b-r})^e + \\ f(d_{r-wopt} - d_{r-w})^g + h(d_{g-wopt} - d_{g-w})^i + j(d_{b-wopt} - d_{b-w})^k \end{bmatrix},$$

where $d_{r-gopt}$, $d_{g-bopt}$, $d_{b-ropt}$ are the Euclidean distances between the CIE coordinates of a selected set of optimal red-green, green-blue, blue-red primaries; $d_{r-wopt}$, $d_{g-wopt}$, $d_{b-wopt}$ are the Euclidean distances between the CIE coordinates of the optimal red, green, and blue primaries and the CIE coordinates of the selected white point; $d_{r-g}$, $d_{g-b}$, $d_{b-r}$ are the Euclidean distances between the red-green, green-blue, and blue-red CIE coordinates for the red, green and blue OLED materials; and $d_{r-w}$, $d_{g-w}$, $d_{g-b}$ are the Euclidean distances between the CIE coordinates for the red, green, blue OLED materials and the CIE coordinates of the selected display white point; a, c, f, h and j are all scaling constants and b, d, e, g, i, and k are constants that will normally be greater than 1 to discourage the selection of a single primary that is close to the whitepoint.

11. The method claimed in claim 8, wherein the luminance stability over time are defined as:

$$T_i = cI^d$$

where c and d are constants and I is the current density through the subpixel.

12. The method claimed in claim 8, wherein the combinations include materials that emit red, green and blue light, respectively.

13. The method claimed in claim 8, wherein a combination of three different OLED materials are used to form the color display device.

14. The method claimed in claim 8, wherein a combination of more than three different OLED materials are used to form the color display device.

15. A method of determining an optimal combination of OLED emissive materials to be used to construct a plurality of subpixels of different colors in a pixel of a display device, wherein selection of materials are based on the luminance efficiency of the OLED materials, the chromaticity and luminance of a target display white point, and the luminance stability over time of the OLED materials, comprising the steps of:
  a) measuring chromaticity coordinates for a plurality of materials;
  b) selecting aim chromaticity coordinates and luminance of a target display white point;
  c) for a plurality of combinations of the OLED materials,
    i) calculating a required luminance for a subpixel using the chromaticity coordinates of the OLED materials, and the aim chromaticity coordinates and the luminance of the target display white point,
    ii) selecting an initial light emissive area for each subpixel,
    iii) providing an optical transmission factor for each subpixel,
    iv) calculating an actual luminance for each subpixel using the initial areas and optical transmission factors for the subpixel,
    v) determining a functional relationship between current density and luminance output for each subpixel,
    vi) calculating an aim current density for each subpixel,
    vii) determining a functional relationship between current density and a luminance stability over time for each subpixel,
    viii) calculating a lifetime for each subpixel using the aim current density and the luminance stability functions and defining a display lifetime as the minimum subpixel lifetime,
    ix) calculating a figure of merit for the color gamut for each combination;
  d) using an optimization criterion that includes the display lifetime and color gamut figure of merit to select one of the plurality of combinations of OLED materials for use in the display.

16. The method claimed in claim 15, wherein the lifetime of the display is determined according to the equation:

$$L_i = f(E_i, T_i, Y_i)$$

where $L_i$ is the lifetime of the display; $E_i$ are the luminance efficiencies of the OLED materials used to construct the differently colored subpixels; $T_i$ are the luminance stability over time of the OLED materials used to construct the differently colored subpixels; and $Y_i$ are the luminances of the differently colored subpixels necessary to obtain a white point of a specified luminance and chromaticity coordinate.

17. The method claimed in claim 15, wherein the figure of merit is determined according to the equation:

$$G = \begin{bmatrix} a(d_{r-gopt} - d_{r-g})^b + c(d_{g-bopt} - d_{g-b})^d + (d_{b-ropt} - d_{b-r})^e + \\ f(d_{r-wopt} - d_{r-w})^g + h(d_{g-wopt} - d_{g-w})^i + j(d_{b-wopt} - d_{b-w})^k \end{bmatrix},$$

where $d_{r-gopt}$, $d_{g-bopt}$, $d_{b-ropt}$ are the Euclidean distances between the CIE coordinates of a selected set of optimal red-green, green-blue, blue-red primaries; $d_{r-wopt}$, $d_{g-wopt}$, $d_{b-wopt}$ are the Euclidean distances between the CIE coordinates of the optimal red, green, and blue primaries and the CIE coordinates of the selected white point; $d_{r-g}$, $d_{g-b}$, $d_{b-r}$ are the Euclidean distances between the red-green, green-blue, and blue-red CIE coordinates for the red, green and blue OLED materials; and $d_{r-w}$, $d_{g-w}$, $d_{g-b}$ are the Euclidean distances between the CIE coordinates for the red, green, blue OLED materials and the CIE coordinates of the selected display white point; a, c, f, h and j are all scaling constants and b, d, e, g, i, and k are constants that will normally be greater than 1 to discourage the selection of a single primary that is close to the whitepoint.

18. The method claimed in claim 15, wherein the luminance stability over time are defined as:

$$T_i = cI^d$$

where c and d are constants and I is the current density through the subpixel.

19. The method claimed in claim 15, wherein the combinations include materials that emit red, green and blue light, respectively.

20. The method claimed in claim 15, wherein a combination of three different OLED materials are used to form the color display device.

21. The method claimed in claim 15, wherein a combination of more than three different OLED materials are used to form the color display device.

* * * * *